United States Patent [19]

Liao et al.

[11] Patent Number: 4,767,721
[45] Date of Patent: Aug. 30, 1988

[54] DOUBLE LAYER PHOTORESIST PROCESS FOR WELL SELF-ALIGN AND ION IMPLANTATION MASKING

[75] Inventors: Kuan Y. Liao, Irvine; William W. Y. Lee, Saratoga, both of Calif.

[73] Assignee: Hughes Aircraft Company, Los Angeles, Calif.

[21] Appl. No.: 827,140

[22] Filed: Feb. 10, 1986

[51] Int. Cl.4 .................. H01L 21/308; H01L 21/265
[52] U.S. Cl. ........................................ 437/34; 357/42; 437/29; 437/56; 437/944
[58] Field of Search ..................... 437/29, 34, 56, 944; 357/42

[56] References Cited

U.S. PATENT DOCUMENTS

| 4,435,896 | 3/1984 | Parillo et al. | 437/34 |
| 4,489,101 | 12/1984 | Shibata | 437/944 |
| 4,509,991 | 4/1985 | Taur | 437/34 |
| 4,525,920 | 7/1985 | Jacobs et al. | 437/34 |
| 4,558,508 | 12/1985 | Kinney et al. | 437/34 |
| 4,578,859 | 4/1986 | Hause et al. | 437/34 |

FOREIGN PATENT DOCUMENTS

| 0100736 | 2/1984 | European Pat. Off. . |
| 0164737 | 12/1985 | European Pat. Off. . |
| 0171111 | 2/1986 | European Pat. Off. . |
| 0178440 | 4/1986 | European Pat. Off. . |
| 0181501 | 5/1986 | European Pat. Off. . |

1495186 12/1977 United Kingdom .

OTHER PUBLICATIONS

IEEE Journal of Solid-State Circuits, vol. SC-15, No. 4, Aug. 1980, Y. Todokoro: "Double-Layer Resist Films for Submicrometer Electronbeam Lithography", pp. 508-513, See pp. 511, 512, Section III: Experiment.

Primary Examiner—Upendra Roy
Attorney, Agent, or Firm—Kenneth W. Float; A. W. Karambelas

[57] ABSTRACT

A technique is disclosed for obtaining a self-aligned twin-well structure in a CMOS process. A double layer of two different photoresist materials is employed to obtain an overhang photoresist structure used for the p-well masking and ion implantation process. After the p-well implantation, pure aluminum is deposited over the wafer, forming a first layer over the p-well region and a second layer over the photoresist layers. A metal lift-off procedure is performed to dissolve the photoresist layers and thereby remove the second layer of metal. The first layer of aluminum remaining on the wafer forms a conjugate of the p-well pattern and serves as the n-well mask for ion implantation. The invention provides a straightforward method for achieving the self-aligned twin-well structure in CMOS processes, and is adapted to high energy ion implantation for achieving retrograde impurity profiles.

25 Claims, 3 Drawing Sheets

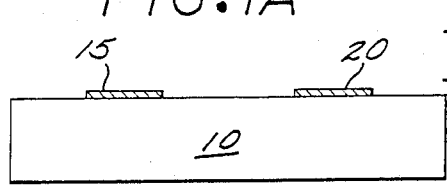
FIG. IA
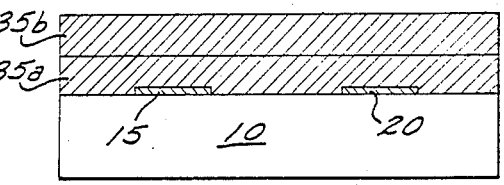
FIG. IB
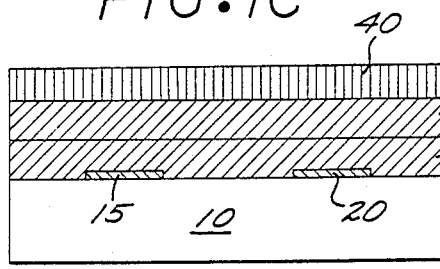
FIG. IC
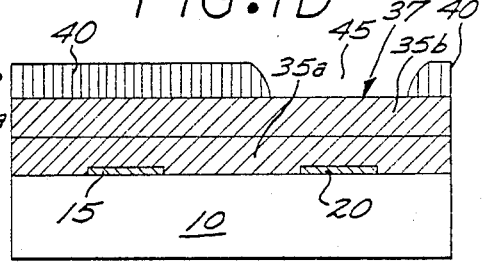
FIG. ID
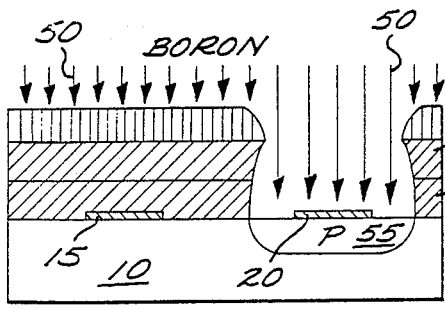
FIG. IE
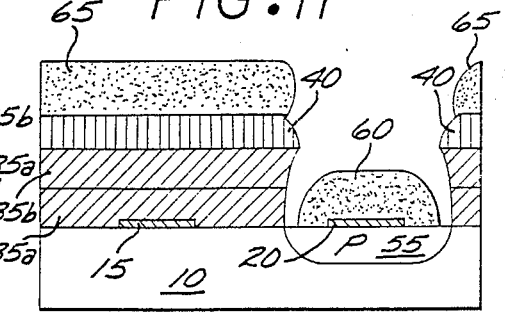
FIG. IF
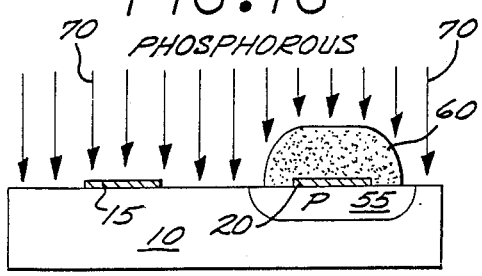
FIG. IG
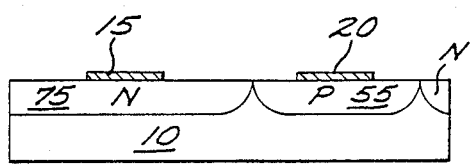
FIG. IH

DOUBLE LAYER PHOTORESIST PROCESS FOR WELL SELF-ALIGN AND ION IMPLANTATION MASKING

BACKGROUND OF THE INVENTION

The invention relates generally to Complementary-Metal-Oxide-Silicon (CMOS) fabrication processes, and more particularly to a self-aligning process for fabricating aligned twin "wells" or "tubs" in a semiconductor substrate. This process is economical in that the number of masking steps are minimized and the effective use of substrate or "chip" area is maximized. Furthermore, economy is also enhanced by the high yield capability of this process.

Silicon gate CMOS processes are in wide use in the manufacture of VLSI circuit chips. Double layer photoresist masking is becoming popular in the industry.

The twin-well CMOS technology has been employed to allow separate optimization of the p and n channel transistors. In this technology, adjacent p-type and n-type regions or wells are formed in a substrate. The n-channel transistors are formed on the surface of the p-type well and the p channel transistors are formed on the surface of the n-type well. Because separate n and p wells are formed, the impurity concentration in each well may be optimized independently of the other, thereby allowing the p and n channel transistors to be optimized.

The assignee of the present invention is presently employing a self-aligned process for fabricating circuits having twin retrograde wells. "Retrograde" refers to the dopant impurity concentration profile wherein the concentration is highest at a distance below the wafer surface. As is known, using a retrograde twin-well profile facilitates the prevention of circuit "latch-up." To obtain the retrograde profile, high energy ion implantation is typically employed, which requires that the masks used to define the active area provide adequate shielding against the implantation process. Moreover, the process presently employed by the assignee requires separate masks be employed to define the p and n well regions. The use of separate masks leads to alignment difficulties, increases the complexity and number of process steps and reduces circuit densities.

U.S. Pat. No. 4,435,896 discloses one attempt to solve some of the problems of the known twin-well processes. The process disclosed in that patent employs thin nitride and oxide masking layers to mask the respective wells in a self-aligned process wherein only one mask is employed. However, the process would not be suitable for the formation of twin-well structures having a retrograde profile. The thin nitride and oxide layers would not withstand the high energy ion implantations employed to obtain the retrograde profile, which requires ion energies of at least around 400 kev. To withstand such high energy ion bombardment, the required thicknesses of the nitride and oxide layers would be on the order of two to three microns; employing layers of that thickness would lead to cracking problems at the interface between the oxide and nitride layers. Thus, the process disclosed in U.S. Pat. No. 4,435,896 appears useful for low energy ion implantations with subsequent impurity drive-in steps, and does not appear suitable to form twin-well structures having a retrograde profile.

It would, therefore, be an advance in the art to provide an improved CMOS process for fabricating self-aligned, twin-well CMOS structures with retrograde impurity concentration profiles, and which requires a relatively low number of individual process steps.

A need exists for a CMOS, twin-well process which requires only a single-well mask to form the twin-well structure and is able to withstand high energy ion implantation.

SUMMARY OF THE INVENTION

A double layer photoresist and metal lift-off technique is employed for p-well masking and ion implantation in the fabrication of a twin-well CMOS structure. The wafer is coated with two layers of two different photoresist materials to achieve a substantially planar top surface. During this step, a high temperature treatment of the bottom layer of the photoresist is carried out. After the top layer of photoresist is applied and patterned by a conventional p-well mask technique, the wafer is exposed by blanket deep UV radiation, and the bottom layer of photoresist is developed through the opening pattern formed in the top layer. The resulting double layer photoresist pattern can sustain high dose and high energy Boron ion implantation up to $2 \times 10^{14}$ ions/cm$^2$ and 380 Kev needed for deep retrograde wells. After the p-well ion implantation, a thick layer of aluminum is deposited over the wafer, resulting in a first layer covering the exposed p-well region, and a second layer, covering the photoresist layers and elevated above the first metal layer as a result of the double photoresist layers. A selective metal lift-off procedure then follows. The metal left on the surface forms a conjugate pattern of the p-well and serves as the n-well mask for subsequent n-well implantation. As a result of the process, a self-aligned twin-well structure is formed.

BRIEF DESCRIPTION OF THE DRAWINGS

These and other features and advantages of the present invention will become more apparent from the following detailed description of an exemplary embodiment thereof, as illustrated in the accompanying drawings, in which:

FIGS. 1A–1H are partial cross-sectional views of a circuit undergoing manufacture in accordance with principles of the invention, and illustrate structures attained by individual method steps.

DETAILED DESCRIPTION OF THE PREFERRED EMBODIMENT

Figure 2:
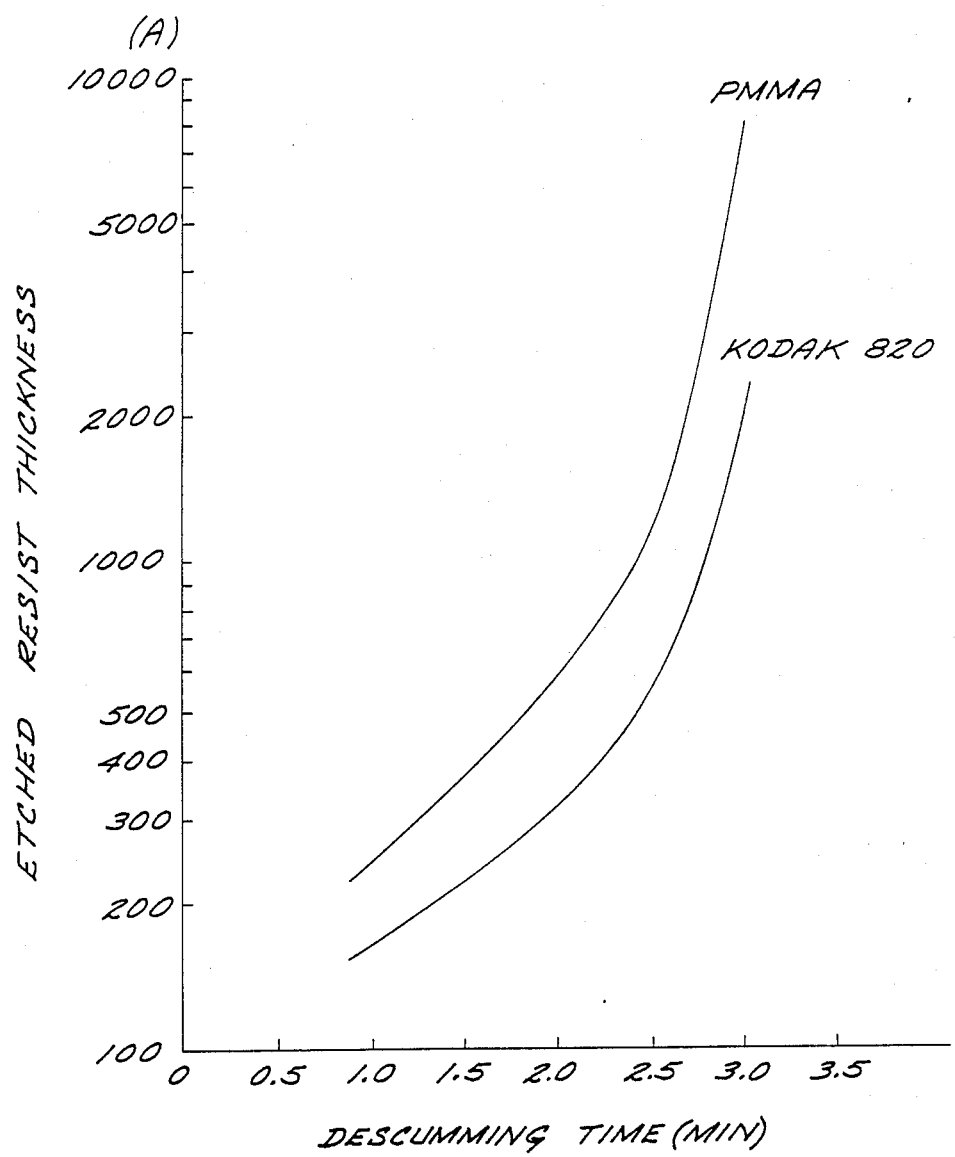
FIG. 2 is a graph plotting the etched thickness of the two photoresist layers employed in the preferred embodiment versus the descumming time.

The present invention comprises a novel layer process for twin-well self-alignment and ion implantation masking. The following description is to enable persons skilled in the art to make and use the invention, and is provided in the context of a particular application and its requirements. In the following description, numerous specific details are set forth, such as specific temperatures, time periods, doping levels and the like, in order to provide a thorough understanding of the invention. It will be obvious to one skilled in the art that the present invention may be practiced without these specific details. In other instances, well-known steps are not described in detail so as not to obscure the invention.

Referring now to FIGS. 1A–1H, cross-sectional views are shown of a circuit undergoing manufacture in accordance with the invention. A wafer structure 10 is produced by conventional techniques. The substrate 10 is <100> N-type silicon with a resistivity in the range of 1.1 to 1.8 ohm-cm. As shown in FIG. 1A, silicon nitride layers 15,20 are formed on the wafer 10 and have a nominal thickness of 1000Å.

While the substrate 10 illustrated in FIGS. 1A–1H is depicted as substantially planar, for purposes of clarity in illustrating the present invention, the substrate employed in fabrication will preferably have a trenched surface, with the trench formed between the nitride layers 15, 20, so that the layers 15, 20 are disposed on elevated mesas. A trenched wafer is employed to prevent latch-up, and per se forms no part of the present invention.

During the first step of the inventive process, a thick layer 35 of PMMA photoresist, preferably about 3 $\mu$m, is applied to the trenched wafer, followed by a thin layer of Kodak 820 photoresist, preferably about 1 $\mu$m. The PMMA resist material and the Kodak 820 resist materials are conventionally used in semiconductor fabrication fabrication processes, and are well known to those skilled in the art. An important feature is that there is good adhesion between the Kodak 820 and PMMA resist materials. The exposed surface of Kodak 820 resist layer 40 is virtually planar.

The photoresist coating step is carried out by preheating the wafer at 250° C. for thirty minutes. As illustrated in FIG. 1B, a 1.5 $\mu$m thick coating or layer 35a of PMMA photoresist is applied. This photoresist material is marketed by KTI Chemical, Inc., and is exposed by radiation in the deep ultraviolet (UV) wavelength range. The photoresist is applied and the layer 35a formed using a conventional spin technique to obtain a planarized layer. This coating process is followed by a high temperature reflow bake of the wafer at 190° C. for thirty minutes. A second 1.5 $\mu$m thick layer 35b of PMMA photoresist is applied and the coated wafer again baked at 190° C. for thirty minutes. The high temperature treatments inhibit distortion of the photoresist structure during subsequent hot bake procedures for the ion implantation masking. The resulting structure is shown in FIG. 1B, with layers 35a and 35b having a combined thickness of about 3 $\mu$m.

Two coatings of the PMMA photoresist are applied to ensure that a sufficient thickness is achieved to planarize a trenched surface, i.e., so that the top surface of the PMMA photoresist is substantially planar. For some applications, only one coating of PMMA resist may be sufficient for the purpose.

In the next step, a thin (1 $\mu$m) layer of Kodak 820 photoresist, a second resist material, is coated on top of layer 35b of the PMMA photoresist. The Kodak 820 resist is marketed by the Eastman Kodak Company and is exposed by UV light having a wavelength of about 436 nanometers. This layer 40 is applied and planarized by a similar spinning technique discussed with respect to the PMMA layers. After this layer is applied, the wafer is baked at 90° C. for thirty minutes. The resulting structure is shown is FIG. 1C.

The two photoresist materials are selected so that one is exposed and developed by dissimilar process steps required to expose and develop the other material. The PMMA and Kodak 820 resists meet this requirement. An important feature is that there is good adhesion between the Kodak 820 and the PMMA photoresist materials.

In the next step, a conventional p-well mask is employed to provide the appropriate p-well pattern in the upper photoresist layer 40. This may be carried out, for example, by exposing the resist layer 40 through the p-well mask using conventional mask aligner equipment, followed by developing for 80 seconds in a 1:1 mixture of Waycoat developer and distilled water. The Waycoat developer is marketed by Philip A. Hunt Chemical Corporation, Los Angeles, Calif., and is known to those skilled in the art. This results in the p-well opening pattern formed in layer 40, which comprises opening 45 in layer 40 as shown in FIG. 1D. Thus, the second layer 40 of photoresist is selectively removed in the region indicated by reference numeral 45.

Following the p-well mask step, a two minute conventional plasma descum procedure is carried out to etch the exposed interface layer 37 formed between the two photoresist materials due to chemical reaction of the two different types of resist materials. For example, the plasma etching apparatus marketed under the name "Plasmaline" by TEGAL Corporation, Novato, Calif., may be employed; typical descumming parameters are (i) 200 W power, (ii) 0.7 torr pressure, and (iii) 25 ccm flow rate of $O_2$ gas for 1.5 to 2 minutes. The etched thickness of the 820 and PMMA materials is plotted as a function of the descumming time in FIG. 2.

The next step of the process is to selectively expose the PMMA resist by flood-exposing the patterned wafer as shown in FIG. 1D by deep ultraviolet (UV) radiation at a nominal wavelength of 220 $\mu$m and an intensity of 18 MW/cm$^2$. The nominal exposure time for the 3 $\mu$m thickness of layers 35a and 35b is 4 minutes.

Figure 3:
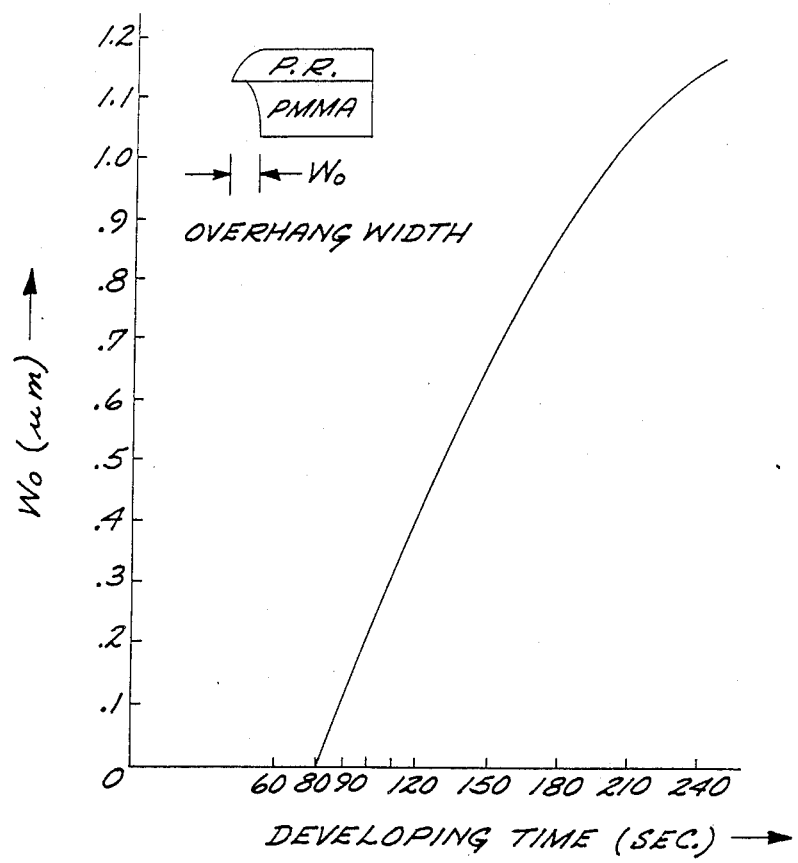
FIG. 3 is a plot of the overhang width of the second layer of photoresist to the first layer as function of the developing time in chlorobenzene.

Following the deep UV exposure, the PMMA resist is selectively developed, through the p-well opening pattern formed in the layer 40, in chlorobenzene for 90 seconds to 200 seconds, depending on the desired size of the overhang width $W_o$ of the upper photoresist layer 40 in relation to the lower layers 35a, 35b. The overhang width increases as the developing time in chlorobenzene is increased. FIG. 3 plots the width $W_o$ ($\mu$m) as a function of the developing time in chlorobenzene, where the thickness of the PMMA layers 35 is 3 $\mu$m and the PMMA exposure time is 4 minutes at an intensity of 18 MW/cm$^2$.

Following the development in chlorobenzene, the patterned wafer is developed in zylene for 90 seconds, rinsed in distilled water for 2 minutes, and then spun dry. The resulting double layer photoresist overhang structure is shown in FIG. 1E. The developed wafers are then hard baked at 125° C. for 30 minutes.

In the next step of the process, also indicated in FIG. 1E, the p-well ion implantation is performed. A high energy Boron ion implantation is employed, indicated by arrows 50, for introducing the p-type impurities into the wafer to form the p-well 55. The implantation nominally occurs at a dose of about $5 \times 10^{13}$ cm$^{-2}$ and an energy level of about 380 Kev. The combination of the Kodak 820 and PMMA resist layers can sustain high energy and high dose ion implantation necessary to achieve a retrograde impurity profile. Thus, photoresist layers 35a, 35b and 40 comprise a resist mask on the substrate with a p-well opening pattern formed therein for defining the lateral extent of the p-well. This resist mask is adapted to selectively mask the substrate from the high energy, high dose ion implantation employed to form the p-well with a retrograde impurity profile.

Figure 4:
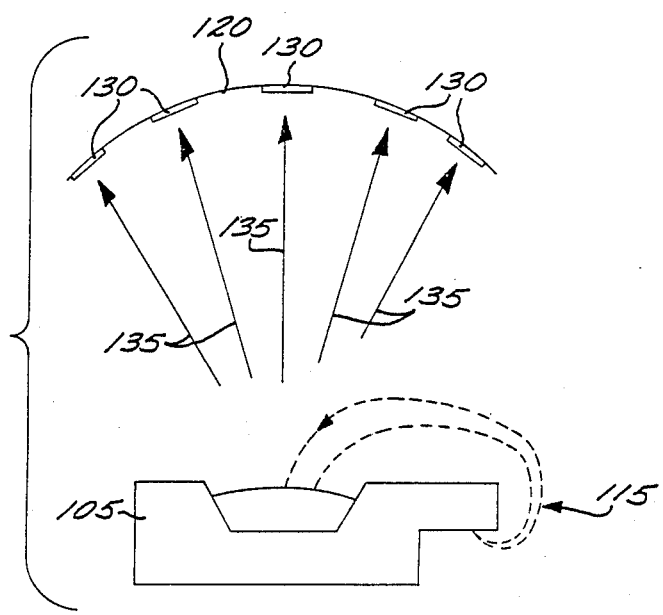
FIG. 4 is a simplified illustration of the apparatus employed in the metallization step of the process.

In the next step of the process, a 2 μm thickness of aluminum is deposited onto the wafer at a deposition angle of about 90° relative to the plane of the wafer. An electron beam evaporation source is preferably employed in the metallization step. Such sources are known in the art, and are described, for example, in the book "VLSI Technology," edited by S. M. Sze, McGraw-Hill, 1983, at Section 9.2.2. An electron beam sputtering system which may be employed in the metallization step is the Auto-Tech II system marketed by CHA Industries, Palo Alto, Calif. As illustrated in FIG. 4, a charge of aluminum 110 is placed in the water cooled copper hearth 105. A hot filament supplies current to the electron beam 115, which are accelerated through a potential and strike the aluminum charge 110 to be evaporated.

A hemispherical dome 120 covers the evaporation source to define a deposition chamber. The wafers 130 to be metallized are disposed in wafer holders (not shown) affixed to the interior surface of the dome 120. The charge 110 is evaporated by operation of the evaporation source, as indicated by the arrows 135 in FIG. 4, depicting the flow of evaporated aluminum outwardly from the source to the wafers. The shape of the aluminum charge and the radius of the hemispherical dome are cooperatively selected so that the aluminum is deposited on the wafers at a deposition angle of about 90° relative to the plane of the wafers.

As is shown in FIG. 1F, the overhang double-layer photoresist structure on the wafer results in a discontinuous metallization of the wafer, with gaps being formed between the layer 60 of aluminum covering the region 30 of the wafer and the layer 65 covering the photoresist layers. It is this discontinuity between the regions of the deposited aluminum which is exploited in the next step of the process.

The aluminum deposited wafer is subsequently processed by a selective metal lift-off procedure, wherein the wafer is immersed in an acetone solution for 40 minutes and then vibrated in an ultrasonic vibration tank for 20-30 seconds. An illustrative equipment which may be employed in this step is the cavitator ultrasonic cleaner no. 11700 marketed by Ladd Research Industries, Inc.

One aspect of the metal lift-off procedure is that the wafer is suspended in the acetone solution during the ultrasonic vibration. The metal lift-off procedure results in the photoresist layers 35,40 being dissolved by the acetate solution which is admitted into contact with the photoresist layers through the gap between the metal layers. As the photoresist layers dissolve and the wafer undergoes ultrasonic vibration, the aluminum layer 65 lifts off the wafer, leaving only aluminum layer 60 deposited on the wafer. The aluminum layer 60 serves as the mask for the subsequent n-well ion implantation step.

Following the ultrasonic vibration, the residue photoresist is stripped from the wafer by a conventional strip solution, such as solutions marketed by KTI Chemical, Inc. The resultant wafer structure is shown in FIG. 1G.

The n-well ion implantation occurs in the next step, shown schematically by arrows 70 in FIG. 1G. This implantation is of phosphorus ions, at 780 Kev for a dose of $5 \times 10^{13}$ cm$^{-2}$. The n-well implantation provides n-type impurities into the wafer and results in the formation of the n-well 75 shown in FIG. 1G. The remaining aluminum layer 60 masks the p-well from implantation by the phosphorus ions. After the phosphorus implantation, the aluminum layer 60 is removed by a conventional metal etch process. The resulting wafer comprises a self-aligned twin-well structure having a retrograde impurity profile. The process requires only a single-well mask; the requirement for a separate, second well mask has been eliminated.

The following is a list of specific processing steps which may be used to practice the present invention:
1. Photoresist Coating
    (a) preheat wafer at 250° C., thirty minutes
    (b) first coating of PMMA, 1.5 μm
    (c) bake at 190° C., thirty minutes
    (d) second PMMA coating, 1.5 μm
    (e) bake at 190° C., thirty minutes
    (f) Kodak 820 coating, 1 μm
    (g) soft bake at 90° C., thirty minutes
2. 820 Exposing and Developing
    (a) expose through p-well mask by Canon mask aligner (model PLA-501 FA) for 2.7 seconds
    (b) develop for 80 seconds in 1:1 mixture of KTI developer and distilled water
3. Descum for two minutes
4. Blanket deep UV Exposure
    (a) radiation wavelength is 220 μm
    (b) intensity is 18 mw/cm$^2$
    (c) exposure time is four minutes
5. PMMA Developing for overhang structure formation
    (a) develop in chlorobenzene for 90 to 200 seconds
    (b) develop in Xylene for 90 seconds
    (c) rinse in distilled water for two minutes and spin dry
6. Metal deposition
    (a) pure aluminum
    (b) 1.7 to 2.0 μm thickness
    (c) 90° deposition angle
7. Metal lift-off
    (a) immerse in Acetone for 40 minutes
    (b) vibrate in ultrasonic vibration tank for 10 to 30 seconds
    (c) strip residue photoresist by microstrip solution It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention. For example, other appropriate semiconductor materials can be substituted for silicon. The bulk region in which the wells are formed may be p-type rather than n-type. Other impurities of like conductivity type may be substituted for boron or phosphorus for forming the wells and other techniques used besides ion implantation for doping the substrate. Other materials appropriate for forming the various layers used for screening the implants may be substituted for those used in the preferred embodiment.

What is claimed is:
1. A process for forming closely aligned wells or tubs in a semiconductor substrate comprising:
    (a) providing a semiconductor substrate and depositing a resist mask thereon comprising a lower layer of a first photoresist material and an upper layer of a second photoresist layer, with an opening defining the lateral extent of a first well, said resist mask defining an overhang structure around the periphery of said opening, the thickness of said resist mask being sufficient to withstand ion bombardment;

(b) implanting ions through said opening to form a first well;

(c) depositing discontinuous metal over said resist mask and opening to thereby cover said first well, the thickness of said metal covering said first well being sufficient to withstand ion bombardment;

(d) removing said resist mask and metal thereon, leaving in place the metal covering said first well; and (e) implanting ions into said substrate adjacent the metal covering said first well to thereby form a second well directly adjacent said first well, whereby adjacent twin wells are formed in a relatively high yield process requiring a relatively low number of individual process steps.

2. The process of claim 1 wherein said opening is formed in said upper resist layer, and said first resist material is subsequently exposed and overdeveloped so as to form said overhang structure.

3. The invention of claim 1 wherein said step of removing said resist mask and metal thereon comprises:
(i) immersing said substrate in a resist dissolving solution; and
(ii) vibrating the immersed substrate by ultrasonic vibration means, whereby the resist is removed and the metal thereon lifted off the substrate.

4. The process of claim 1 wherein said step of implanting ions to form a first well comprises high energy, high dose implantation and wherein said resist layer is adapted to sustain said high energy, high dose implantation.

5. The process of claim 2 wherein said step of depositing discontinuous metal over said resist mask comprises metal deposition at a deposition angle of about 90°, and said resist mask defines an overhang structure around the periphery of said opening, whereby the metal covering the resist mask is discontinuous with the metal covering of said first well.

6. The process of claim 5 wherein said step of depositing discontinuous metal over said resist mask comprises the steps of:
providing an electron beam evaporation source for evaporating a metal charge;
providing an evaporation chamber about said source, said chamber being defined by a chamber surface comprising a hemispherical surface; whose radius is cooperatively selected with the shape of said charge so that the metal is evaporated toward said hemispherical surface at about a 90° deposition angle;
affixing said substrate inside said chamber adjacent said hemispherical surface; and
operating said source to evaporate said metal charge.

7. In a process for producing twin wells implanted with doping materials in the manufacture of complimentary MOS (CMOS) field effect transistor circuits, the improvement comprising a sequence of the following steps:
(i) applying a first layer of a first photoresist material to a semiconductor wafer;
(ii) applying a second layer of a second photoresist material to said first layer to form a double layer of photoresist on the wafer;
(iii) employing a first well mask to selectively expose the second layer of photoresist material, and thereafter developing the second layer in the first well pattern to provide a first well opening in the second photoresist material;
(iv) selectively exposing and thereafter developing the first layer of photoresist through the first well pattern opening formed in the second layer of photoresist;
(v) using the photoresist structure to selectively screen the wafer, providing impurities of a first conductivity type into unscreened portions of the wafer to form a first well region;
(vi) depositing metal onto the patterned wafer, whereby a first metal layer is deposited over the first well region and a second metal layer is formed over the first and second photoresist layer, wherein a gap is formed between the first and second metal layers;
(vii) removing the first and second layer of photoresist to lift off the second layer of metal from the wafer; and
(viii) using the first layer of metal to selectively screen the wafer, providing impurities of a second conductivity type into the unscreened portions of the wafer to form a second well region.

8. The invention of claim 7 wherein said step of providing said impurities of said second conductivity type comprises ion implantation.

9. The invention of claim 7 wherein said step of providing said impurities of said second conductivity type comprises ion implantation.

10. The invention of claim 7 wherein said step of depositing metal onto the patterned wafer comprises vacuum deposition of said metal.

11. The invention of claim 7 wherein said step of removing the first and second layers of photoresist material to lift off the second layer of metal comprises:
(i) immersing the wafer in a solution which dissolves the photoresist materials for a period of time; and
(ii) vibrating the immersed wafer by ultrasonic vibration means, whereby the photoresist layers are removed and said second layer of metal is lifted off the wafer.

12. The invention of claim 7 wherein said first layer of metal is formed in the conjugate of the first well mask.

13. The invention of claim 7 wherein said step of exposing and developing the first layer of photoresist form an overhang photoresist structure, wherein the second layer of photoresist defining the first well opening overhangs the portion of the first layer defining the first well opening.

14. The invention of claim 7 wherein said first and second photoresist materials have good adhesion to each other, and are exposed and developed by dissimilar process steps.

15. The invention of claim 7 wherein said step of applying said first layer of said first photoresist material comprises:
(a) applying a first coating of said first photoresist material;
(b) hard baking the coated wafer;
(c) applying a second coating of said first photoresist material; and
(d) hard baking the coated wafer; whereby a relatively thick layer of the first photoresist layer is formed on the wafer.

16. The invention of claim 11 wherein during said step of vibrating the immersed wafer, the wafer is suspended in the developing solution.

17. The invention of claim 15 wherein said step of applying said second layer of said second photoresist material results in a relatively thin layer.

18. A complimentary metal-oxide-semiconductor (CMOS) process, comprising the steps of:
  (i) forming a relatively thick layer of a first photoresist material on a silicon substrate;
  (ii) forming a relatively thin layer of a second photoresist material on said layer of said first photoresist material, said first and second photoresist materials being selected so that one is exposed and developed by dissimilar process steps from those required to expose and develop the other;
  (iii) employing a first well mask to selectively expose the layer of the second photoresist material, and thereafter developing said material to provide a first well opening pattern in the second photoresist material;
  (iv) exposing and developing the first photoresist material through the first well pattern formed in the second photoresist material so as to form an overhang structure, wherein the second photoresist material overhangs the first photoresist material about the well opening;
  (v) using the photoresist overhang structure to selectively screen the wafer, providing impurities of a first conductivity type into unscreened portions of the substrate to form a first well region of said first conductivity type;
  (vi) depositing metal onto the patterned layer, whereby a first metal layer is deposited over the first well region of the substrate, and a conjugate second layer is formed on the second photoresist material, the second metal layer being elevated by the photoresist materials in relation to the first metal layer;
  (vii) removing the first and second photoresist materials to lift the second metal layer off the substrate; and
  (viii) using the first layer of metal to selectively screen the substrate, providing impurities of a second conductivity type into the unscreened portions of the substrate to form a second well region of a second conductivity type in a self-aligned relationship with the first well region.

19. The invention of claim 18 wherein said step of exposing and developing the first photoresist material is adapted to allow selection of a desired width of said overhang structure.

20. The invention of claim 18 wherein said first well is a p-type well, and said second well is an n-type well.

21. The invention of claim 18 wherein said step of providing impurities of a first conductivity type comprises ion implantation of said impurities.

22. The invention of claim 18 wherein said step of providing impurities of a second conductivity type comprises ion implantation of said impurities.

23. The invention of claim 18 further including the step of hard baking the substrate and said layers of photoresist materials before the step of providing impurities of said impurities of said first conductivity type into said substrate.

24. The invention of claim 18 wherein said step of removing the first and second photoresist materials to lift off the second metal layer comprises:
  (a) immersing the substrate in a solution which dissolves the photoresist materials; and
  (b) vibrating the immersed substrate, whereby the second metal layer is lifted off the substrate.

25. The invention of claim 24 wherein said substrate is vibrated by ultrasonic vibration means, and wherein said substrate is suspended in said solution while said vibration occurs.

* * * * *